United States Patent [19]

Kuznicki

[11] Patent Number: 5,032,825
[45] Date of Patent: Jul. 16, 1991

[54] BATTERY CAPACITY INDICATOR

[75] Inventor: William J. Kuznicki, Coral Springs, Fla.

[73] Assignee: Motorola, Inc., Schaumburg, Ill.

[21] Appl. No.: 487,311

[22] Filed: Mar. 2, 1990

[51] Int. Cl.$^5$ .............................................. G08B 21/00
[52] U.S. Cl. ............................... 340/636; 340/825.44; 324/427; 320/48
[58] Field of Search ....................... 340/636, 825.44; 324/429, 427; 320/48

[56] References Cited

U.S. PATENT DOCUMENTS 4,180,770 12/1979 Eby ......................................... 324/429
4,888,716 12/1989 Ueno .................................. 324/429 X

OTHER PUBLICATIONS

"Bravo" Series Numeric Display Pagers, Theory and Maintenance Manual, publication 68P81047C95-0, published Jul., 1989 in Boynton Beach, Fla. by Motorola, Inc. on p. 2, section I, entitled Battery Check & Monitor.

Primary Examiner—Edward L. Coles, Sr.
Assistant Examiner—Jeffery A. Hofsass
Attorney, Agent, or Firm—Philip P. Macnak; Vincent B. Ingrassia; William E. Koch

[57] ABSTRACT

A battery capacity indicator is described which measures the battery terminal voltage at two discharge rates, monitoring the resultant differential battery voltage at predetermined time intervals, and comparing the resultant differential battery voltage to a set of predetermined differential battery voltages which are stored within a memory within the battery powered device. Each of the predetermined differential battery voltages corresponds to one of a set of predetermined battery capacities for each type of battery used in the device. The battery capacity indicator provides to the user a continuous display of the available battery capacity.

20 Claims, 6 Drawing Sheets

BATTERY CAPACITY INDICATOR

BACKGROUND OF THE INVENTION

1. Field of the Invention

This invention relates generally to the field of battery capacity indicator circuits, and in particular to a battery capacity indicator circuit for use in battery powered devices having visual displays.

2. Description of the Prior Art

Figure 1:
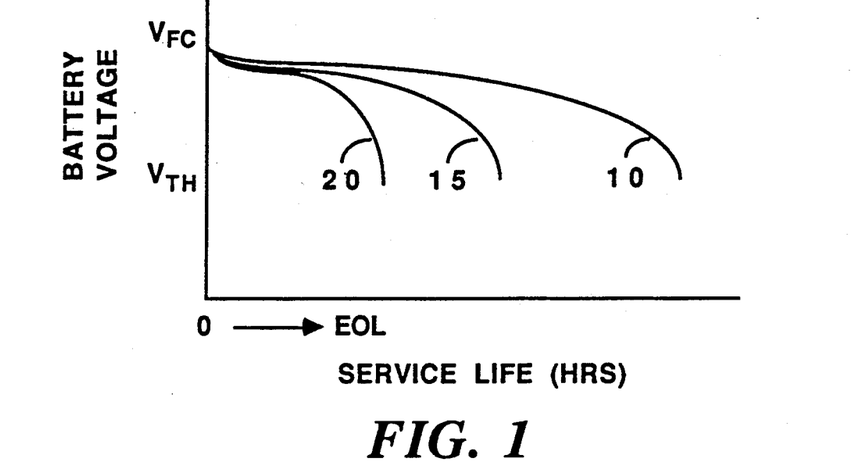
FIG. 1 is a graph showing a plot of battery life versus battery terminal voltage for a battery operating at several discharge rates.

FIG. 1 is a graph which shows a plot of battery life versus battery terminal voltage for a battery operating at several discharge rates. As can be observed from the battery life curves, the battery life obtainable from the battery is a function of the load which is coupled to the battery. For a relatively high value resistive load, such as indicated by curve 10, a relatively long battery life is obtained. For a nominal resistive load, such as indicated by curve 15, a nominal value battery life is obtained. And for a relatively low value resistive load, such as indicated by curve 20, a relatively short battery life is obtained. It will be appreciated, that the actual battery life obtained is a function of both the load, which determines the actual discharge rate, and the type and size of battery in use, which determines the battery capacity. Primary batteries, such as carbon-zinc batteries, provide low energy capacities, whereas zinc-air and lithium batteries provide high energy capacities. Other primary batteries, such as silver-oxide, manganese, alkaline, and mercury, batteries fall in between these two extremes. Still other batteries, such as NiCd secondary batteries provide a much lower energy capacity than that of the primary batteries of equivalent size, however, this disadvantage is compensated for by the fact the batteries can be repeatedly charged, thereby providing very long battery life before the battery must be replaced. Because of this large variation in the battery energy capacities for the different types of batteries, most prior art battery capacity indicators, such as those utilized in battery powered communication devices, have resorted to simply measuring the terminal voltage either under load, or at a predetermined time interval after the load has been removed, which resulted in a go/no-go indication of the end of life (EOL) of the battery. Once the measured voltage fell below a predetermined threshold voltage, the prior art battery capacity indicators provided a sensible alert indicating the end of life of the battery, and that the battery should be replaced or recharged. As a result, many users of such battery operated devices often found themselves with dead batteries, as the prior art battery capacity indicators provided no indication of the rate at which the battery was being discharged, or an indication of the amount of energy remaining within the battery.

SUMMARY OF THE INVENTION

It is an object of the present invention to provide a battery capacity indicator providing an indication of the battery capacity representative of the type of battery in use.

It is a further object of the present invention to provide a battery capacity indicator for use in a portable communication device having a visual display.

It is a further object of the present invention to provide a battery capacity indicator having a visual display which provides a continuous indication of the battery capacity remaining during use.

These and other objects of the invention are achieved by providing a battery capacity indicator for a battery powered device which comprises a voltage measurement circuit, for measuring the battery terminal voltage at first and second discharge rates, and for generating a differential battery voltage value which corresponds thereto. A memory stores a set of predetermined differential battery voltage values and a set of predetermined battery capacity values, each of the set of predetermined differential battery voltage values defining one of the set of predetermined battery capacity values. A comparison circuit couples to the memory and to the voltage measurement circuit for comparing the measured differential battery voltage values with the set of predetermined differential battery voltage values to select the predetermined battery capacity value corresponding thereto. A display couples to the comparison circuit for displaying the indicia indicating the selected predetermined battery capacity value.

A battery powered communication receiver having a display for displaying received selective call messages and a battery capacity indicator for providing a continuous display of the battery capacity which comprises a receiver section for receiving selective call messages and a battery saver circuit for controlling the power to the receiver section to effect the discharge of the battery at first and second discharge rates. A voltage measurement circuit measures the battery terminal voltage at the first and second discharge rates and generates a voltage differential value corresponding thereto. A memory stores a set of predetermined differential battery voltage values and a set of predetermined battery capacity values, each of the set of predetermined differential battery voltage values defining one of the set of predetermined battery capacity values. A comparison circuit couples to the memory and to the voltage measurement circuit for comparing the measured differential battery voltage values with the set of predetermined voltage differential values to select the predetermined battery capacity value corresponding thereto. A display is coupled to the comparison circuit for displaying the indicia indicating the selected predetermined battery capacity value.

BRIEF DESCRIPTION OF THE DRAWINGS

The features of the invention which are believed to be novel are set forth with particularity in the appended claims. The invention itself, together with its further objects and advantages thereof, may be best understood by reference to the following description when taken in conjunction with the accompanying drawings, in the several figures of which like reference numerals identify identical elements, in which, and wherein:

DESCRIPTION OF THE PREFERRED EMBODIMENTS

Figure 2:
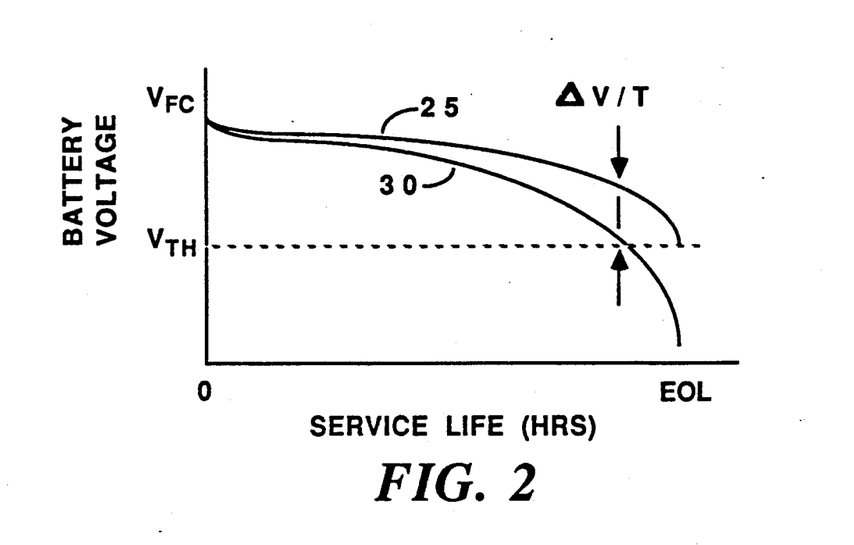
FIG. 2 is a graph showing a plot of the differential battery terminal voltage characteristic utilized by the battery capacity indicator of the present invention.

Referring to the figures, FIGS. 2 and 3B through 6 described the preferred embodiment of the present invention, a battery capacity indicator which provides a continuous visual display of the battery capacity representative of the type of battery in use. In particular, FIG. 2 is a graph showing a plot of the differential terminal voltage characteristics of a typical battery as the battery is discharged to the end of life voltage. In the graph shown, the fully charged terminal voltage for a secondary battery, or the off the shelf terminal voltage for a fresh primary battery is indicated as $V_{FC}$. The end of life terminal voltage for either battery type is indicated as $V_{TH}$. Two discharge curves are shown in FIG. 2, a first curve 25 representing a battery being discharged at a first discharge rate, and a second curve 30 representing a battery being discharged at a second discharge rate which is different than the first discharge rate. In the example shown in FIG. 2, the second discharge rate is greater than the first discharge rate, resulting in a measurably lower terminal voltage at the second discharge rate. As also shown, the differential battery terminal voltage increases with time due to the change in the internal cell resistance of the battery as the battery is discharged.

Figure 3A:
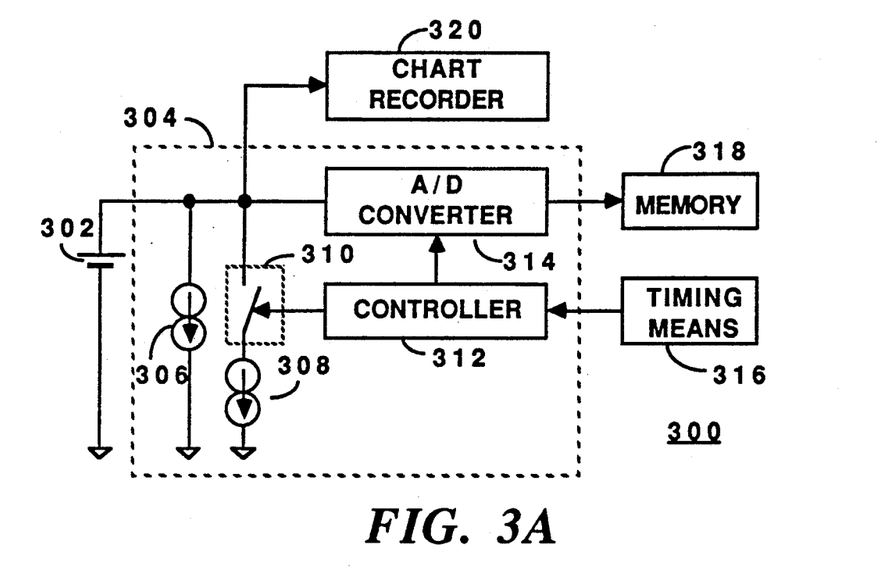
FIG. 3A is an electrical block diagram of a measurement device capable of characterizing the discharge characteristics of batteries.

The discharge curves of FIG. 2 are generated in a manner as shown in FIG. 3A. As shown in FIG. 3A, the battery 302 being tested is coupled to a voltage measurement circuit 304 which is capable of measuring the battery terminal voltage at first and second discharge rates. The first discharge rate is controlled, as shown, by a first discharge means 306. The second discharge rate is controlled by a second discharge means 308 which is switched into the circuit by switch 310. The first and second discharge means can be implemented in any of a number of ways, such as constant current sources, resistive elements or the actual circuit elements in the battery powered device. While switch 310 is shown as a mechanical switch, such as a normally open relay switch, it will be appreciated other forms of switching can be provided as well, such as transistor switching. It will further be appreciated that while switch 310 is shown to be normally open, the measurements can be achieved with switch 310 normally closed, and intermittently opened.

A controller 312 controls the duration that second discharge means 308 is switched into the circuit. A timing means 316 generates the timing signals utilized by controller 312 to establish the time intervals during which switch 310 is switched out, and a first discharge rate established by first discharge means 306, and the time intervals during which switch 310 is switched in, and a second discharge rate is established by first discharge means 306 being in parallel with second discharge means 308. The actual discharge characteristics are monitored either through the use of an A/D converter 314, which periodically digitizes the battery terminal voltage, at the first and second discharge rates and effects the storage of the result in a memory 318. The discharge rate can alternately be monitored using a chart recorder 320 which continuously records the battery terminal voltage at the first and second discharge rates. The measurement circuit 300 can be used to characterize each of the various types of batteries which can be used in a particular battery operated device, tracking the battery discharge characteristics from fully charged through discharged, at two discharge rates, as are often encountered in battery operated devices such as battery operated devices having battery saving functions. By characterizing a number of batteries of each battery type, a set of differential battery terminal voltages can be determined which correspond to a set of battery capacity values, such as battery terminal voltage values corresponding to a fully charged battery, 90% charged or 10% discharged battery, 80% charged or 20% discharged battery, and so forth. When this information is coupled with the operation of the battery capacity indicator of the present invention as shown in FIG. 3B, a continuous indication of the state of a battery in use in a battery powered device is obtained, as will be described in further detail below.

Figure 3B:
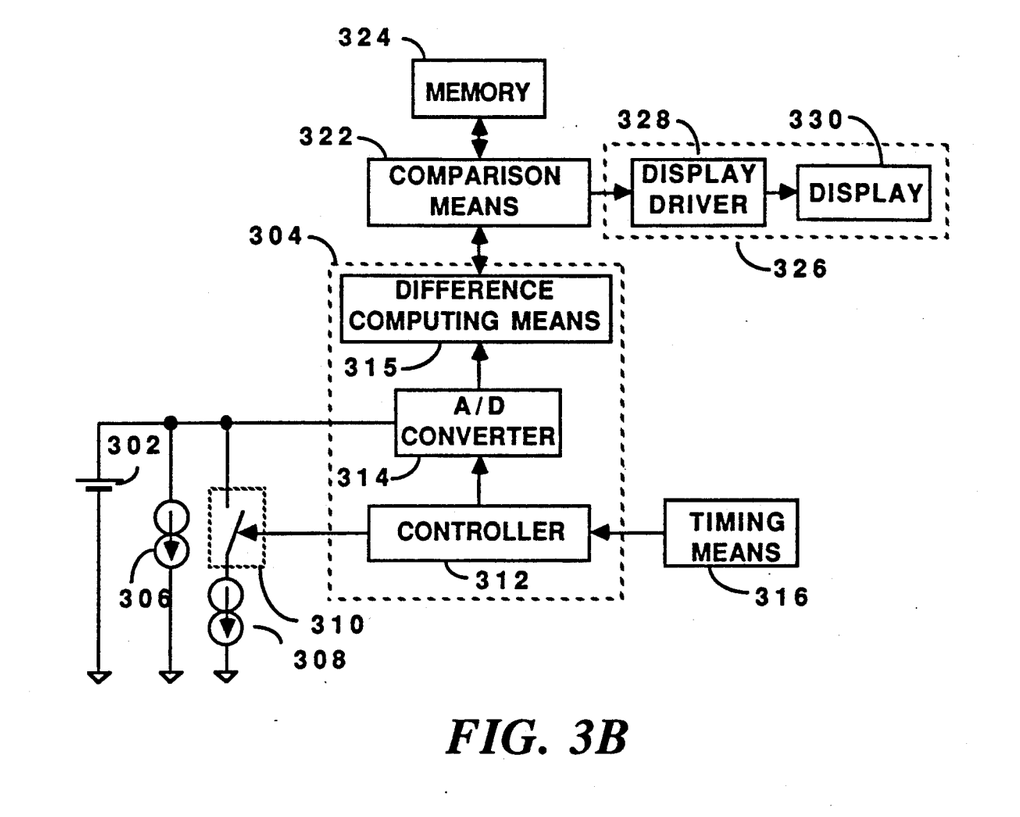
FIG. 3B is an electrical block diagram of the preferred embodiment of the battery capacity indicator of the present invention.

The battery capacity indicator of the present invention is shown in FIG. 3B. A battery 302 couples to a voltage measurement means 304 which measures the battery terminal voltages at first and second discharge rates and from these measured rates generates a voltage differential value. The first discharge rate is controlled by a first circuit means 306, which represents operation of the battery powered device at the first discharge rate while the second discharge rate is controlled by a second circuit means 308 which can be intermittently switched into the circuit by switch 310 and represents the operation of the battery powered device at the second discharge rate. It will be appreciated that first circuit means 306 is representative of the battery powered device operating at a standby discharge rate, whereas the second circuit means 308 and switch means 310 provide the equivalent function of a battery saver function in battery operated devices.

A controller 312 can control the intermittent switching of switch 310 to establish the second discharge rate when the second discharge rate is not periodically generated within the battery powered device. A timing means 316 generates timing signals which are utilized by the controller 312 to generate the time intervals during which switch 310 is switched in, and the battery is being loaded at the second discharge rate and further generates the timing signals for measurement of the battery terminal voltages at the first and second discharge rates. An A/D converter 314 is coupled to the controller 312 and to the battery 302 to periodically measure the battery terminal voltage at the first and second discharge rates, converting the analog battery terminal voltage into a digital signal representative of the magnitude of the battery terminal voltage. A/D converters which can measure the terminal voltage of a battery are well known in the art. The output of A/D converter 314 couples to the input of difference computing means 315 which includes at least two registers to temporarity store the digitized battery terminal voltage values at the first and second discharge rates, and a means for generating the differential voltage value, such as a circuit performing 2's complement subtraction. A comparison means 322 is coupled to the output of the difference computing means 315, and to a memory means, such as memory 324. Memory 324 is preferably a read only memory (ROM), such as a programmable read only memory (PROM) or an electrically erasable programmable read only memory (EEPROM). Other read only memory devices may be used as well. Memory 324 stores the set of predetermined battery capacity values which correspond to the predetermined voltage differential values, such as that measured in the measurement circuit of FIG. 3A. It will be appreciated memory 324 may store a plurality of sets predetermined voltage differential values which correspond to the set of predetermined battery capacity values, and it will be further appreciated memory 324 may be suitably programmed so as to indicate to comparison means 322 which set of predetermined voltage differential values is to be utilized corresponding to the battery type which is in use in the device and which is being monitored by the battery capacity indicator of the present invention. As will be described in detail below, comparison means 322 generates a plurality of output signals corresponding to each of the set of battery capacity values As the voltage differential value of the battery exceeds a particular one of the set of predetermined voltage differential values, an output signal corresponding to the predetermined battery capacity values is selected by comparison means 322. This output signal is coupled to the input of display means 326 which displays indicia indicating the selected predetermined battery capacity value. Display means 326 comprises a display driver 328 which receives the output from comparison means 322 and drives display 330. Display 330 in the preferred embodiment of the present invention is an LCD display having indicia corresponding to the set of predetermined battery capacity values, such as indicia indicating "100", "90", "80", and so forth. It will be appreciated other forms of displays, such as individual LEDs identified by permanently marked indicia, and LED displays which would illuminate to present the indicia indicating "100", "90", "80", and so forth, would be suitable for use as well.

To summarize the description presented above it will be appreciated the battery capacity indicator of the present invention monitors the increasing differential battery voltage at predetermined time intervals, and compares the differential battery voltages to a set of predetermined differential battery voltages which are stored within a memory within the battery powered device. The predetermined differential battery voltages are determined in the manner described above, and correspond to a set of predetermined battery capacities for each type of battery to be monitored. The battery capacity indicator provides to the user a continuous display of the available battery capacity, as will be further described in detail below.

Figure 4A:
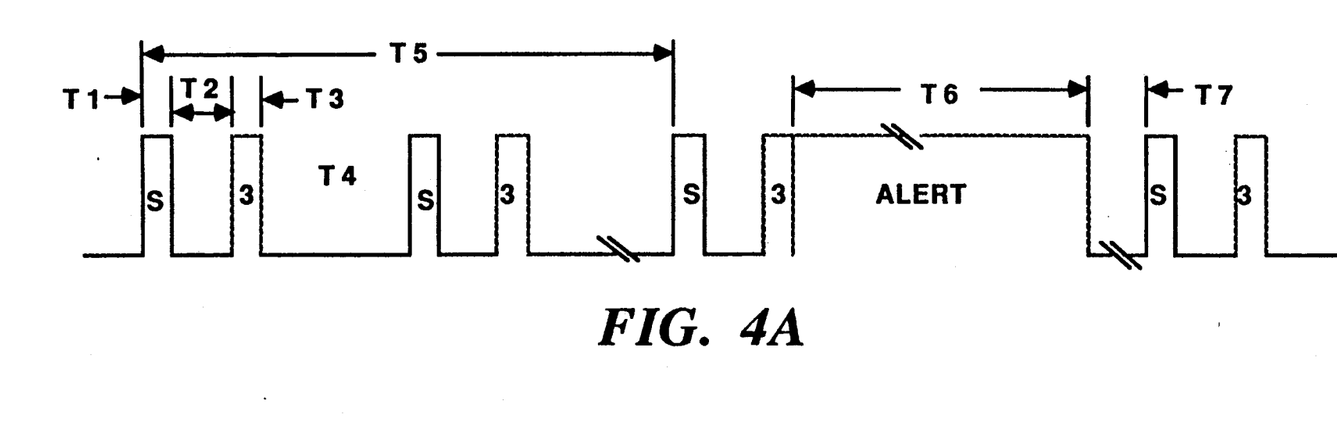
FIGS. 4A and 4B are timing diagrams showing the operation of the battery capacity indicator of the present invention.

As described above, the measurement system of FIG. 3A allows the characterization of different battery types at discharge rates which are typical of that encountered in the operation of a battery operated device. Battery operated communication devices, such as pagers, are switched from a first discharge rate to a second discharge rate during the normal battery saver operation. FIG. 4 is a timing diagram showing the battery saver operation for a pager operating in the Post Office Code Standardization Advisory Group signaling format. As shown in FIG. 4A, the pager is intermittently turned ON and OFF to provide the battery saver function. During time intervals T1 and T3 the receiver is switched ON so that the decoder can synchronize to the transmitted synchronization codeword and can decode any transmitted addresses and messages, in a manner well known in the art. During time intervals T2 and T4 the receiver is switched OFF. When the receiver is switched OFF, the receiver is operating at a very low current drain, such as 0.6 milliamperes (mA) or less, whereas when the receiver is turned ON the current drain is significantly higher, such as 5.5 mA. The current drain numbers indicated are representative of typical paging receivers in use today, and it will be appreciated can differ greatly between pager models and pager manufacturers.

Figure 4B:
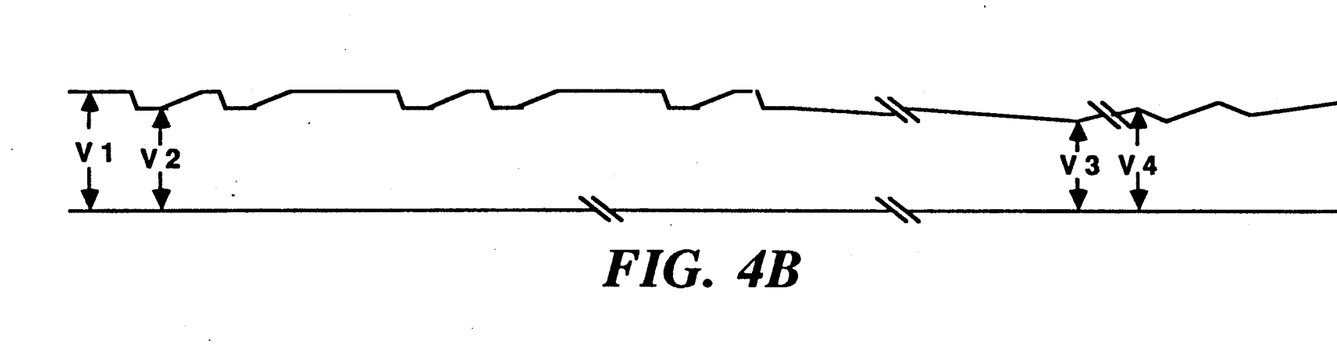

Each time power is switch to the receiver, the battery terminal voltage drops due to the higher discharge rate, as shown in FIG. 4B. During the low current standby discharge rate, the battery presents a terminal voltage V1. When the receiver is switched ON the battery terminal voltage will drop as indicated by V2. When power to the receiver is again switched OFF, the battery terminal voltage will again recover to V1. It will be appreciated, as energy is withdrawn from the battery, the voltage V1 will decrease, the amount of decrease depending upon the type of battery in use. It will also be appreciated the voltage V2 continues to drop at a greater rate, as described above as energy is withdrawn from the battery. Because the rate of change of the battery terminal voltage is small, the actual measurement of the differential battery voltage need not be made each time the receiver is turned ON, but may be made at less frequent intervals, such as indicated by interval T5. The battery capacity measurement may be made at any convenient interval, such as every fifth or tenth interval. It will also be appreciated from FIG. 4A, after an address has been decoded by the pager, and the user is alerted, the discharge rate during alerting (interval T6) may be an order of magnitude greater than during the receiver ON current drain. As a result, in the preferred embodiment of the present invention, measurement of the battery voltages is suspended for a period of time T7, such as until the next fifth or tenth battery power cycle, to allow the battery voltage to sufficiently recover, otherwise an erroneous measurement will be made.

Figure 5:
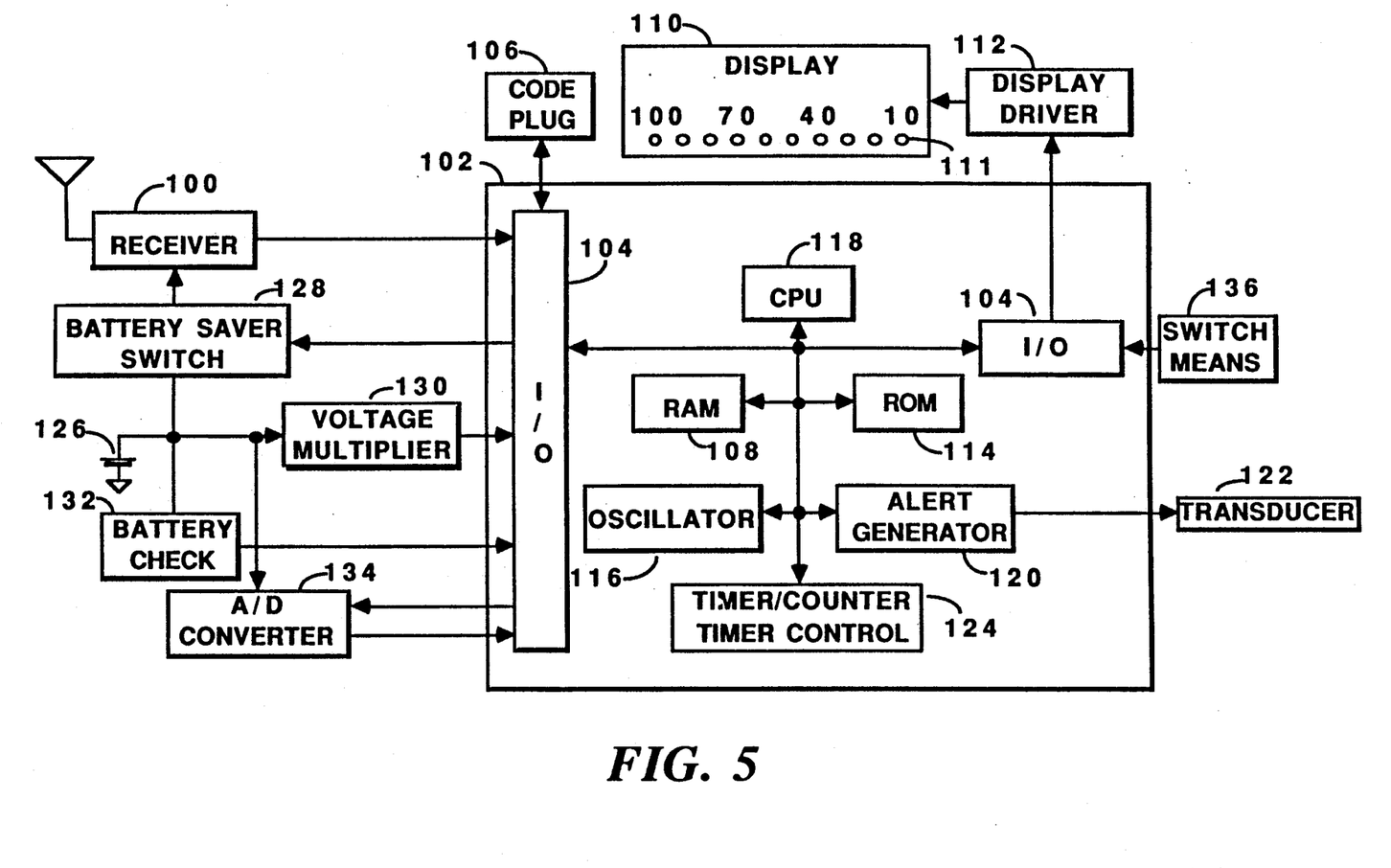
FIG. 5 is an electrical block diagram of a portable communication receiver utilizing the battery capacity indicator of the present invention.

As described above, the battery capacity indicator of the present invention can be utilized to provide a continuous display of the battery capacity when utilized with battery operated devices. FIG. 5 which shows one example of a battery powered device having a display which utilizes the battery capacity indicator of the present invention. In particular, FIG. 5 shows a battery powered communication receiver, such as a pager. The operation of such battery powered devices, such as pagers, are well known in the art, and only a brief description of their operation is to be presented herein.

Battery powered communication receivers, such as shown in FIG. 5 comprise a receiver 100 for receiving transmitted messages. The transmitted messages are transmitted in any of a number of signaling formats, including tone coded signaling formats, such as the Motorola 5 tone signaling format, or binary coded signaling formats, such as the Motorola Golay Sequential Code (GSC) signaling format or the POCSAG signaling format. For purposes of the following description, the operation of the battery capacity indicator will be described for a pager having a battery saver and operating with the POCSAG signaling format, although it will be appreciated the operation of the battery capacity indicator is not limited to use with the POCSAG signaling format.

The output of receiver 100, which is a digital stream of binary information corresponding to the received addresses and messages transmitted on the channel, which is coupled to an input of microcomputer 102. In the description herein, receiver 100 is a conventional frequency modulated (FM) receiver which is well known in the art. Microcomputer 102 receives the stream of address and message information through an I/O 104 input. Microcomputer 102 performs the address decoding function in a manner well known in the art, comparing the received addresses with addresses to which the pager is assigned and which are stored in code plug 106. Code plug 106 is programmable read only memory such as a EEPROM type read only memory. Microcomputer 102 is implemented utilizing any of a number of microcomputer integrated circuits, such as an MC65HC05C4 microcomputer manufactured by Motorola Inc. In addition to the decoding functions, microcomputer 102 performs the various pager control functions, such as the storing of the received messages into RAM 108, the recalling of the messages stored in RAM 108 and the subsequent display of the stored messages on display 110. The messages which are recalled from RAM 108 are coupled through the I/O 104 output to a display driver 112 for presentation of the received message on display 110. Display 110 is implemented using an LCD display for displaying numeric information, alphanumeric information, or both, depending upon the configuration of the pager. ROM 114 stores the firmware routines required for controlling the operation of the pager including such operations as address decoding, message storage, message display, battery saver operation, and the battery capacity indicator functions to be described in further detail below. Oscillator 116 provides the reference clock for the operation of central processing unit (CPU) 118 which processes the firmware routines stored in RAM 114 for controlling the previously described pager operations. After a message has been received and stored, alert generator 120 generates an alert signal which couples to transducer 122, alerting the pager user a message has been received. Timer/counter 124 is a programmable timer which generates interrupts to provide the battery monitor timer to be described below.

Power is supplied from a single cell battery 126 which couples to battery saver switch 128, although it will be appreciated multiple cell batteries may be utilized as well. The operation of battery saver switch 128 is controlled by the microcomputer 102 through an I/O 104 output, for intermittently supplying power to the receiver 100 in a manner well known in the art, and as previously described in FIG. 4. Battery 126 is coupled to voltage multiplier 130 which steps up the nominal 1.3 volt battery voltage to 2.6 volts for powering the microcomputer 102. The battery 126 also couples to the input of battery check circuit 132. Battery check circuit 132 monitors the battery terminal voltage, and when the battery terminal voltage drops below a predetermined value, such as 0.95 volts, generates a low battery alert output which couples to microcomputer 102 through an I/O 104 input. Alert generator 120 is then activated to produce an alert signal which is coupled to transducer 122, alerting the user of the low battery condition. Battery check circuit 132 performs the same function as that in the prior art, that of alerting the user that the battery level is at the threshold of the pager becoming non-functional. The battery also couples to the input of A/D converter 134. The A/D converter 134 is used to measure the battery voltage during the receiver standby condition and when the power is supplied to the receiver. The microcomputer 102, through an I/O output 104 controls the battery voltage measurements, by supplying power to the A/D converter providing the voltage measurement means for the battery capacity indicator of the present invention. The digital output signal of the A/D converter 134 couples to the microcomputer 102 which functions as the difference computing means to compute the differential battery voltage at each measurement interval, and further which functions as the comparison means, comparing the computed differential battery voltage with the set of predetermined differential battery voltages stored in the code plug 106. Each time the currently measured differential battery voltage exceeds one of the set of predetermined differential battery voltages stored in the code plug 106, the microcomputer 102, through the I/O port 104 generates an output corresponding to the new battery capacity value. The current battery capacity value couples to display driver 112 which drives the indicia on display 110 corresponding to the current battery capacity value. The indicia corresponding to the predetermined battery capacity values are shown as numbers 100, 70, 40 and 10 screened on the LCD and by circular elements 111 which are selectively driven to indicate the current battery capacity. It will be appreciated that other forms of display, such as numeral displays and bar displays may be utilized as well. In this manner the user of the pager is provided a continuous display of the current battery capacity value which can be monitored. By so providing the user with a continuous display of the battery capacity value, the user is capable of anticipating when the battery will need replacement or recharging. As previously described, the code plug 106 may store more than one set of predetermined differential battery voltage values corresponding to each type of battery which may be utilized in the pager. When only a single type of battery is predominantly utilized, the code plug 106 is programmed to indicate to the microcomputer which set of predetermined differential battery voltages values to use for operation of the battery capacity indicator of the present invention. Where more than one type of battery is utilized on a regular basis, a switch means 136, which may normally be utilized to control the operation of the pager, may also be utilized to select the particular set of predetermined differential battery voltage values for the current battery in use.

Figure 6A:
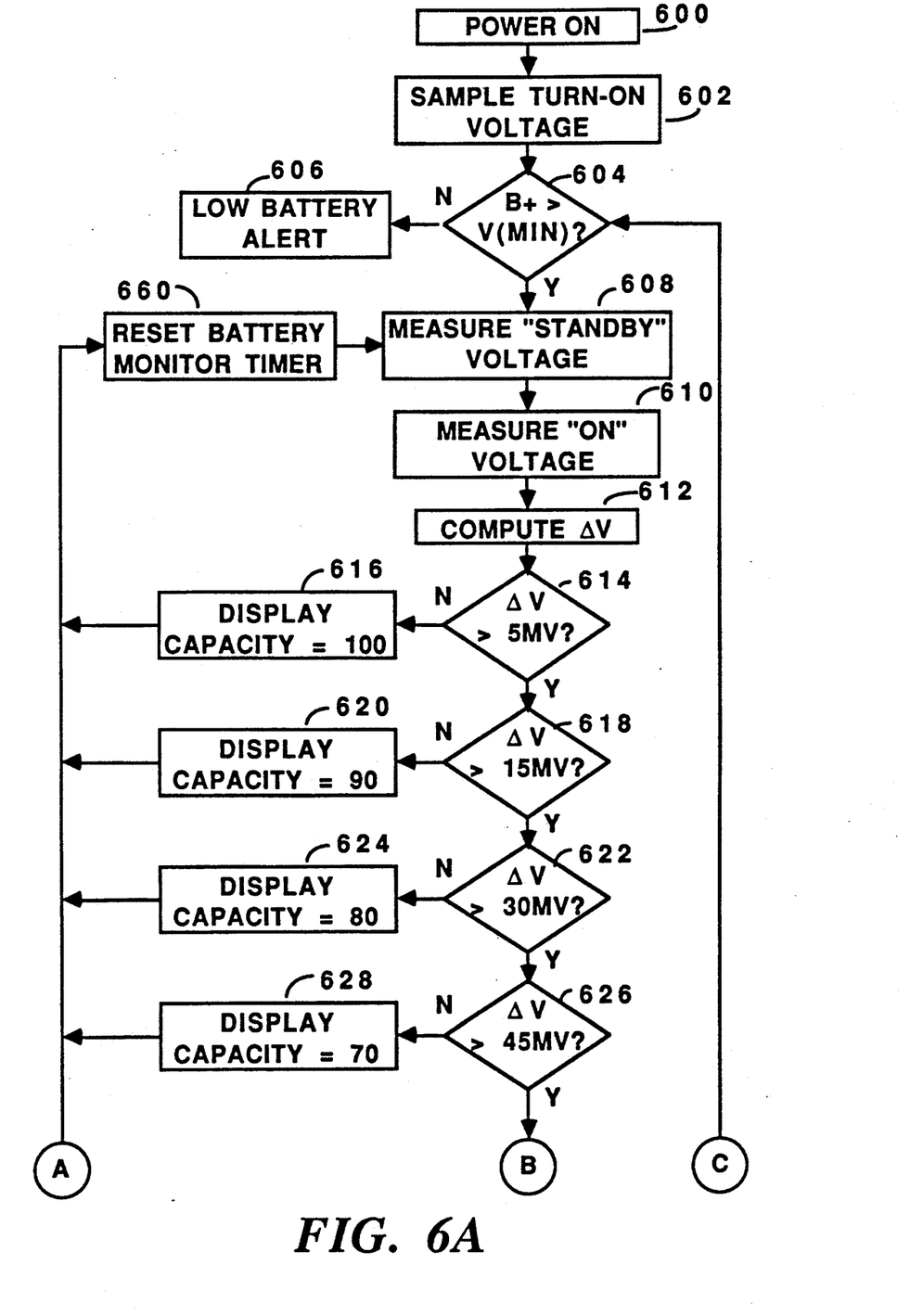
FIGS. 6A and 6B are flow charts describing the operation of the battery capacity indicator.
Figure 6B:
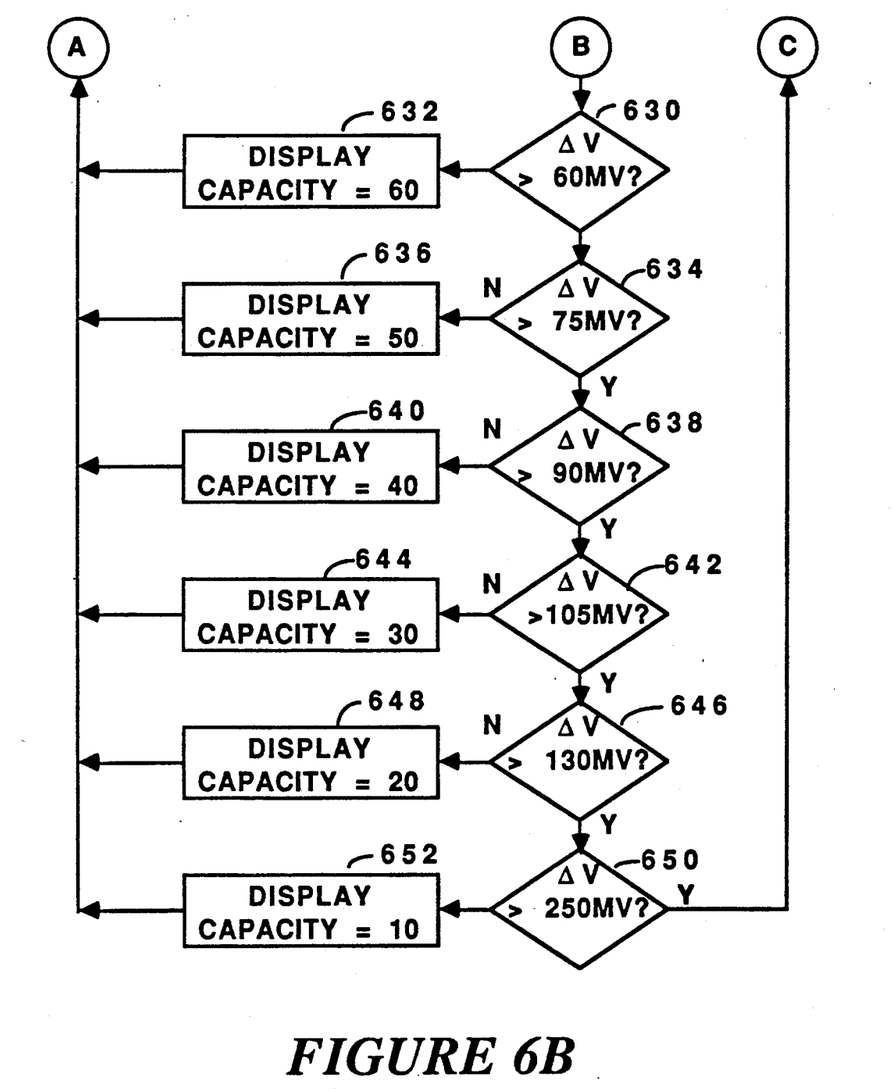

FIGS. 6A and 6B are flow charts describing the operation of the battery capacity indicator of the preferred embodiment of the present invention. As shown in FIG. 6A, when power is turned ON to the battery powered device, at step 600, the battery terminal voltage is sampled, at step 602. When the battery terminal voltage falls below the minimum threshold voltage V(min) required to operate the device, a low battery alert is provided, at step 606, indicating to the user the battery needs to be replaced, or recharged. When the battery is above the minimum operating voltage, the standby voltage is measured, which corresponds to the voltage measured at a first discharge rate, at step 608. The receiver ON voltage, or other voltage at a rate different to the first discharge rate is then measured at step 610. The differential battery voltage $\Delta V$ is calculated, at step 612. The computed differential battery voltage is compared to the first value of the set of predetermined differential battery voltages stored within the device, in this example, the first differential value corresponds to a 5 millivolt (mV) difference, at step 614. When the differential battery voltage is less than this first value, the first battery capacity value corresponding to the differential battery voltage value is displayed, at step 616, which in this example is 100, for 100%. The battery capacity monitor timer is then reset at step 660 until the next time interval during which the battery terminal voltage measurements are made beginning at step 608. When the computed differential battery voltage exceeds the first predetermined differential battery voltage value at step 614, the value is checked against the second predetermined differential battery voltage value, at step 618.

When the differential battery voltage is less than the second value, the second battery capacity value corresponding to the differential battery voltage value is displayed, at step 620, which in this example is 90, for 90%. The battery capacity monitor timer is then reset at step 660 until the next time interval during which the battery terminal voltage measurements are made beginning at step 608. When the computed differential battery voltage exceeds the second predetermined differential battery voltage value at step 618, the value is checked against the third predetermined differential battery voltage value, at step 622.

When the differential battery voltage is less than the third value, the third battery capacity value corresponding to the differential battery voltage value is displayed, at step 624, which in this example is 80, for 80%. The battery capacity monitor timer is then reset at step 660 until the next time interval during which the battery terminal voltage measurements are made beginning at step 608. When the computed differential battery voltage exceeds the third predetermined differential battery voltage value at step 624, the value is checked against the fourth predetermined differential battery voltage value, at step 626.

When the differential battery voltage is less than the fourth value, the fourth battery capacity value corresponding to the differential battery voltage value is displayed, at step 628, which in this example is 70, for 70%. The battery capacity monitor timer is then reset at step 660 until the next time interval during which the battery terminal voltage measurements are made beginning at step 608. When the computed differential battery voltage exceeds the fourth predetermined differential battery voltage value at step 626, the value is checked against the fifth predetermined differential battery voltage value, at step 630.

When the differential battery voltage is less than the fifth value, the fifth battery capacity value corresponding to the differential battery voltage value is displayed, at step 632, which in this example is 60, for 60%. The battery capacity monitor timer is then reset at step 660 until the next time interval during which the battery terminal voltage measurements are made beginning at step 608. When the computed differential battery voltage exceeds the fifth predetermined differential battery voltage value at step 630, the value is checked against the sixth predetermined differential battery voltage value, at step 634.

When the differential battery voltage is less than the sixth value, the sixth battery capacity value corresponding to the differential battery voltage value is displayed, at step 636, which in this example is 50, for 50%. The battery capacity monitor timer is then reset at step 660 until the next time interval during which the battery terminal voltage measurements are made beginning at step 608. When the computed differential battery voltage exceeds the sixth predetermined differential battery voltage value at step 634, the value is checked against the seventh predetermined differential battery voltage value, at step 638.

When the differential battery voltage is less than the seventh value, the seventh battery capacity value corresponding to the differential battery voltage value is displayed, at step 640, which in this example is 40, for 40%. The battery capacity monitor timer is then reset at step 660 until the next time interval during which the battery terminal voltage measurements are made beginning at step 608. When the computed differential battery voltage exceeds the seventh predetermined differential battery voltage value at step 638, the value is checked against the eighth predetermined differential battery voltage value, at step 642.

When the differential battery voltage is less than the eighth value, the eighth battery capacity value corresponding to the differential battery voltage value is displayed, at step 644, which in this example is 30, for 30%. The battery capacity monitor timer is then reset at step 660 until the next time interval during which the battery terminal voltage measurements are made beginning at step 608. When the computed differential battery voltage exceeds the eighth predetermined differential battery voltage value at step 642, the value is checked against the ninth predetermined differential battery voltage value, at step 646.

When the differential battery voltage is less than the ninth value, the ninth battery capacity value corresponding to the differential battery voltage value is displayed, at step 648, which in this example is 20, for 20%. The battery capacity monitor timer is then reset at step 660 until the next time interval during which the battery terminal voltage measurements are made beginning at step 608. When the computed differential battery voltage exceeds the ninth predetermined differential battery voltage value at step 646, the value is checked against the tenth predetermined differential battery voltage value, at step 650.

When the differential battery voltage is less than the tenth value, the tenth battery capacity value corresponding to the differential battery voltage value is displayed, at step 652, which in this example is 10, for 10%. The battery capacity monitor timer is then reset at step 660 until the next time interval during which the battery terminal voltage measurements are made beginning at step 608. When the computed differential battery voltage exceeds the tenth predetermined differential battery voltage value at step 650, the value remains the same thereafter, until which the battery terminal voltage falls below the minimum voltage at step 604, whereupon a low battery alert is generated at step 606.

In order that a flickering of the display be prevented, each time a new battery capacity value is updated, the battery capacity indicator of the present invention compares the measured differential battery voltage against the next predetermined differential battery voltage. This is required, as there is a period of time at each threshold where the battery voltage will recover to a higher terminal voltage.

While the description of FIG. 6 described monitoring the battery capacity in ten percent increments, it will be appreciated, the battery capacity may be monitored in any desired increment, such as one percent increments, or twenty-five percent increments. The resolution to which battery capacity increments can be displayed will be appreciated by one skilled in the art as being limited by the resolution the A/D converter can measure the battery voltages to obtain meaningful differential battery voltage values. For each battery capacity value increment for which a displayed value is desired, a corresponding predetermined differential battery voltage value would have to be obtained, as previously described above. It will also be appreciated, the actual magnitudes shown for the differential battery voltages are shown for example only, and other values would be utilized depending upon the particular battery type in use in the battery powered device.

What has been described herein is a battery capacity indicator for a battery powered device which provides the capability of continuous visual display of the current battery capacity. While specific embodiments of this invention have been shown and described, further modifications and improvements will occur to those skilled in the art. All modification which retain the basic underlying principles disclosed and claimed herein are within the scope and spirit of the present invention.

I claim:

1. A battery capacity indicator for providing a continuous indication of battery capacity for a battery powered device, comprising:
    means for periodically effecting a first and a second positive discharge rate of the battery;
    voltage measurement means, for measuring the battery terminal voltage at said first and second positive discharge rates during the operation of the device, and for generating a differential battery voltage value in response thereto;
    memory means for storing a set of predetermined differential battery voltage values and a set of predetermined battery capacity values, each of the set of predetermined differential battery voltage values defining one of the set of predetermined battery capacity values;
    comparison means, coupled to said memory means and to said voltage measurement means, for comparing the measured differential battery voltage values with the set of predetermined differential battery voltage values, and for selecting the predetermined battery capacity value corresponding thereto; and
    display means, coupled to said comparison means, for displaying indicia indicating the selected predetermined battery capacity value corresponding to the current battery capacity.

2. The battery capacity indicator of claim 1, wherein the set of predetermined differential battery voltage values and the set of predetermined battery capacity values correspond to a predetermined battery type.

3. The battery capacity indicator of claim 2, wherein said memory means stores a plurality of sets of predetermined differential battery voltage values and a set of predetermined battery capacity values, each set of predetermined differential battery voltage corresponding to a different predetermined battery type, and the battery capacity indicator further comprises:
    means for storing an indication of the battery type in use; and
    means for selecting the set of predetermined differential battery voltage values for comparison.

4. The battery capacity indicator according to claim 1, further comprising timing means for generating timing signals, said voltage measurement means being responsive to the timing signals for periodically measuring the battery terminal voltages at the first and second discharge rates.

5. The battery capacity indicator according to claim 1, wherein the battery powered device includes a first circuit means for establishing a first discharge rate and a second circuit means, coupled to said first circuit means, for selectively establishing a second discharge rate, said voltage measurement means comprising:
    controller means, for controlling the measurement of the battery terminal voltages at the first and second discharge rate;
    A/D converter means, coupled to said controller means, and responsive to the battery terminal voltage generated at the first and second discharge rates, for measuring the battery terminal voltages; and
    difference computing means, for computing the differential battery voltage value from the measured battery terminal voltage values.

6. The battery capacity indicator according to claim 5, wherein said second circuit means includes switch means for selectively establishing the second discharge rate.

7. The battery capacity indicator according to claim 6 wherein said controller means couples to the switch means for selectively establishing the second discharge rate.

8. The battery capacity indicator according to claim 1, wherein said memory means is a programmable read only memory.

9. A battery powered communication receiver having a display for displaying received selective call messages and a battery capacity indicator for providing a continuous display of the battery capacity, comprising:
    a receiver section for receiving selective call messages;
    a battery saver me..ns, for controlling the power to said receiver section to effect the discharge of the battery at first and second discharge rates;
    voltage measurement means, for measuring the battery terminal voltage at the first and second discharge rates, and for generating a voltage differential value in response thereto;
    memory means for storing a set of predetermined differential battery voltage values and a set of predetermined battery capacity values, each of the set of predetermined differential battery voltage values defining one of the set of predetermined battery capacity values;
    comparison means, coupled to said memory means and to said voltage measurement means, for comparing the measured differential battery voltage values with the set of predetermined voltage differential values, and for selecting the predetermined battery capacity value corresponding thereto; and
    display means, coupled to decoder means and to said comparison means, for displaying the received selective call messages and further for displaying the indicia indicating the selected predetermined battery capacity value.

10. The battery powered communication receiver of claim 9, wherein the set of predetermined differential battery voltage values and the predetermined battery capacity values correspond to a predetermined battery type.

11. The battery powered communication receiver of claim 10, wherein said memory means stores a plurality of sets of predetermined differential battery voltage values and a set of predetermined battery capacity values, each set of predetermined differential battery voltage corresponding to a different predetermined battery type, and the battery capacity indicator further comprises:
  means for storing an indication of the battery type in use; and
  means for selecting the set of predetermined differential battery voltage values for comparison.

12. The battery powered communication receiver according to claim 9, further comprising timing means for generating timing signals, said voltage measurement means being responsive to the timing signals for periodically measuring the battery terminal voltages at the first and second discharge rates.

13. The battery powered communication receiver according to claim 12, wherein the battery powered communication receiver further comprises:
  decoder means, coupled to said receiver means, for decoding the received selective call messages;
  alerting means, for generating an alert indicating the reception of a message; and
  means responsive to an alert being generated for inhibiting for a predetermined time interval the measurement of the battery terminal voltage.

14. The battery powered communication receiver according to claim 9, wherein said voltage measurement means comprises:
  controller means, for controlling the measurement of the battery terminal voltages at the first and second discharge rate;
  A/D converter means, coupled to said controller means, and responsive to the battery terminal voltage generated at the first and second discharge rates, for measuring the battery terminal voltages; and
  difference computing means, for computing the differential battery voltage value from the measured battery terminal voltage values.

15. The battery powered communication receiver according to claim 9, wherein said memory means is a programmable read only memory.

16. A method for providing a continuous indication of battery capacity for a battery powered portable communication receiver with a display, the receiver having at least two periodically effected discharge rate states, said method comprising the steps of:
  measuring the battery terminal voltage at the first discharge rate during the operation of the device;
  measuring the battery terminal voltage at the second discharge rate during the operation of the device;
  computing the value of the differential battery voltage value measured therebetween;
  comparing the computed voltage differential value with a set of predetermined differential battery voltage values, each of the predetermined differential battery voltage values defining a predetermined battery capacity; and
  displaying an indication of the predetermined battery capacity corresponding to the computed voltage differential value to indicate the current battery capacity.

17. The method according to claim 16, wherein said step of measuring the battery voltage at a first discharge rate, measures the battery voltage with the battery substantially unloaded.

18. The method according to claim 16, wherein said step of measuring the battery voltage at a second discharge rate, measures the battery voltage with the battery loaded.

19. The method according to claim 16, wherein said step of comparing compares the computed voltage differential with a table of predetermined differential battery voltage values corresponding to particular battery types.

20. The method according to claim 16, further comprising the steps of:
  periodically measuring the battery voltages at the first and second discharge rates; and
  updating the display of the indication of the battery capacity.

* * * * *